United States Patent [19]
Schütze et al.

[11] 3,947,869
[45] Mar. 30, 1976

[54] SEMICONDUCTOR DEVICE HAVING INTERNAL JUNCTION PASSSIVATING INSULATING LAYER

[75] Inventors: Hans-Jürgen Schütze; Klaus Hennings, both of Ulm, Germany

[73] Assignee: Telefunken Patentverwertungsgesellschaft m.b.H., Ulm, Germany

[22] Filed: Dec. 14, 1965

[21] Appl. No.: 513,677

[30] Foreign Application Priority Data
Dec. 19, 1964 Germany.................. 27659

[52] U.S. Cl. ............... 357/49; 357/58; 357/55
[51] Int. Cl.² ........................ H01L 27/12
[58] Field of Search........... 317/234, 235, 101 A; 29/577, 580, 583, 589; 357/49, 58, 55

[56] References Cited
UNITED STATES PATENTS

| | | | |
|---|---|---|---|
| 2,953,730 | 9/1960 | Pankove | 317/235 |
| 3,114,663 | 12/1963 | Klerer | 317/235 |
| 3,159,780 | 12/1964 | Parks | 357/49 |
| 3,189,973 | 6/1965 | Edwards et al. | 29/25.3 |
| 3,197,681 | 7/1965 | Broussard | 317/235 |
| 3,210,225 | 10/1965 | Brixey, Jr. | 317/235 |
| 3,220,896 | 11/1965 | Miller | 317/235 |
| 3,253,197 | 5/1966 | Haas | 317/235 |
| 3,309,585 | 3/1967 | Forrest | 317/234 |
| 3,312,881 | 4/1967 | Yu | 357/58 |
| 3,312,881 | 4/1967 | Yu | 317/235 |
| 3,381,182 | 4/1968 | Thornton | 317/234 |
| 3,440,498 | 4/1969 | Mitchell | 317/234 |
| 3,829,889 | 8/1974 | Allison et al. | 357/49 |

FOREIGN PATENTS OR APPLICATIONS

| | | | |
|---|---|---|---|
| 1,421,618 | 11/1965 | France | 317/235 |

OTHER PUBLICATIONS
IBM Technical Disclosure Bulletin, H. N. Yu, Fabrication of Planar Arrays of Semiconductor Chips by Epitaxial Growth, Vol. 7, No. 11, Apr. 1965, p. 1104.

*Primary Examiner*—Martin H. Edlow
*Attorney, Agent, or Firm*—Spencer & Kaye

[57] ABSTRACT

A semiconductor device composed of a semiconductor body having two zones which define a pn-junction between them, which device includes, for improving the high frequency characteristics of the device, a layer of insulating material disposed within the semiconductor body and separating the two zones from one another in the region surrounding the pn-junction.

3 Claims, 11 Drawing Figures

INVENTORS
Hans-Jürgen Schütze &
Klaus Hennings

BY Spencer & Kaye
ATTORNEYS

SEMICONDUCTOR DEVICE HAVING INTERNAL JUNCTION PASSSIVATING INSULATING LAYER

The invention relates to the production of a semiconductor device, and particularly to a transistor device consisting of a semiconductor body which is wholly or partially enclosed by insulating layers.

In the semiconductor art, transistors are produced primarily by the planar method. According to this method, a p-type base zone and an n-type emitter zone are usually produced by successive diffusion into an n-type silicon semiconductor body by means of the photo-mask technique, and then contact is made to these zones. The maximum oscillation frequency of a transistor, that is to say the frequency at which its maximum available gain has dropped to 1, is generally given by the expression $$f_{max} = \frac{1}{4\pi} \sqrt{\frac{1}{r_b c_c t_{ec}}}$$

In this equation, $r_b$ represents the total base resistance, $c_c$ the collector capacitance and $t_{ec}$ the transit time of the charge carriers from the emitter to the collector terminal. In order to obtain a high maximum oscillation frequency for a transistor, it is therefore necessary to make the product $r_b c_c t_{ec}$ as small as possible.

The emitter-to-collector transit time $t_{ec}$ is composed additively of the emitter charging time $t_e$, the base transit time $t_b$ and the collector transit time $t_c$. The emitter charging time $t_e$ is known to be inversely proportional to the emitter current density and can easily be reduced to values below $10^{-10}$ sec. by the application of a large emitter current. However, since the emitter current also flows through the collector path resistance, its value must be maintained sufficiently low in order to avoid generating unnecessary heat. The base transit time $t_b$ is directly proportional to the square of the base thickness w and inversely proportional to the diffusion coefficient $D_n$, for the case where electrons serve as minority charge carriers. In silicon, base transit times below $10^{-10}$ sec. are achieved when the base has a thickness of about 1 $\mu$ and is not too heavily doped. A light base doping is favorable for the reduction of the base transit time because the diffusion coefficient $D_n$ then approaches more closely to that of a pure lattice scattering of the electrons and which, in silicon for example, is higher by more than one order of magnitude than the value associated with Coulomb scattering at impurity centers. The collector transit time $t_c$ is directly proportional to the depletion layer width of the collector barrier layer and inversely proportional to the maximum velocity of the charge carriers. Since maximum electron velocities of some $10^6$ cm/sec. can be expected in silicon, for example, without causing carrier multiplication, the collector transit time through small barrier layer widths of, for example, about 10 $\mu$ assumes values of some $10^{-10}$ sec. Thus heavy doping of the base, and particularly the building-in of a drift field in a known manner, contributes to reducing the collector transit time by creating small barrier-layer thicknesses.

With regard to the base resistance $r_b$, it is sufficient to rely on the base lead-in resistance inasmuch as the internal base resistance is in any case negligible. This is true because, with very high frequency transistors, the charge-carrier emission takes place, as is known, at the boundary of the emission region. In consequence, the base resistance can be kept low if either the base region is heavily doped outside the base drift area, or the base electrode is brought sufficiently close to the emitting emitter edges. In this connection, methods are already known for reducing the base lead-in resistance by heavy doping of the base region. It also has been proposed to produce a base groove by etching and to apply the low-resistance base contact at the bottom of the groove in the immediate vicinity of the emitting emitter edge.

In connection with the above formula, the collector capacitance $c_c$ deserves special attention. When the usual planar technique is employed, this capacitance is automatically predetermined by the base diffusion. An increase in the depletion layer width of the collector barrier layer, and hence a reduction in the collector barrier-layer capacitance, can certainly be achieved by effecting a base diffusion with a very flat diffusion profile. But in this case a collector diffusion capacitance is simultaneously added to the static collector capacitance so that the net collector capacitance $c_c$ is not reduced by this procedure. In addition, the last-mentioned measure has the disadvantage that it causes the base lead-in resistance and the collector transit time to be increased to an undesirable extent.

It is therefore an object of the present invention to increase the maximum oscillation frequency of semiconductor devices.

It is a more specific object of the present invention to reduce the collector capacitance of a semiconductor device, and particularly a transistor, in order to increase the maximum oscillation frequency of the device.

It is another object of the present invention to provide a novel method for manufacturing semiconductor devices, and particularly transistors.

According to the present invention, these objects are achieved by the provision of a semiconductor device including a semiconductor body having at least one zone defining a pn-junction formed in one surface thereof and at least one layer of insulating material disposed on the semiconductor body, which layer at least partially encloses the body and covers the edges of the junction defined by the at least one zone for bounding and passivating this junction.

In further accordance with the present invention, the transistors of the above-described type are produced by providing a monocrystalline semiconductor body having a first type of conductivity, disposing a layer of insulating material on the body in at least each region where a transistor pn-junction is to be formed, providing one opening in the layer for each pn-junction to be formed, and diffusing a region of the opposite conductivity type from that of the body through each opening to form a transistor pn-junction whose edges are bounded and passivated by the insulating material.

Additional objects and advantages of the present invention will become apparent upon consideration of the following description when taken in conjunction with the accompanying drawings in which.

Figure 1A:
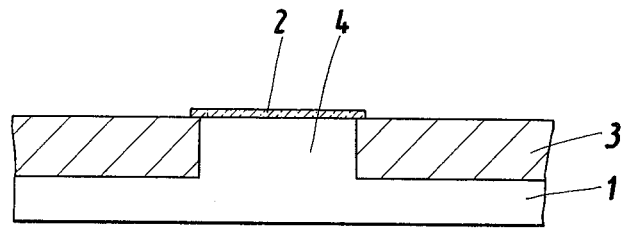
FIGS. 1a, 1b and 1c are partial, cross-sectional views showing three stages in the production of a transistor according to one embodiment of the present invention.
Figure 1B:
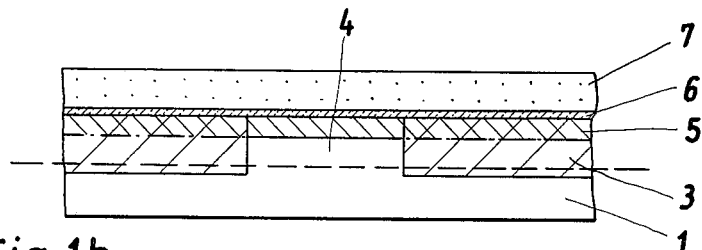
Figure 1C:
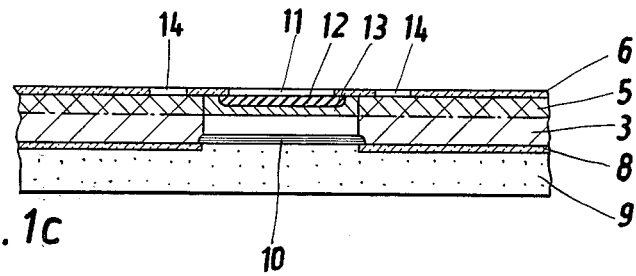

One example of an embodiment of the semiconductor device produced according to the invention is shown in various stages of fabrication in FIGS. 1a to 1c. Referring specifically to FIG 1a, there is shown a monocrystalline semiconductor body 1, for example a silicon semiconductor body of n-type conductivity, provided on one entire surface, preferably by thermal oxidation, with an insulating layer 2, for example of silicon oxide. Then the insulating layer 2 is partially removed, with the aid of a suitable mask, to leave isolated portions, as shown in FIG 1a, which lie upon the required emitter zones and which are somewhat larger than these zones. Then a p$^+$-type diffusion of boron, for example, is carried out to the greatest depth possible (about 10 $\mu$) and with the highest possible surface concentration, so that the diffusion zones 3 are formed in the semiconductor body 1. The presence of the remaining portions of layer 2 leave the undiffused regions 4 of n-type conductivity, as shown in FIG. 1a.

Thereafter, the remaining portions of the insulating layer 2 are removed and a base diffusion is carried out over the whole upper surface of the semiconductor device, for example by the diffusion in impurity atoms producing p-type conductivity, so that a diffusion layer 5 is formed, which layer may have a thickness of 4 $\mu$ for example, as can be seen in FIG 1b. Then the surface of the device is covered with an insulating layer 6, preferably by thermal oxidation, followed by a polycrystalline semiconductor layer 7, preferably by deposition from the gaseous phase. Material is then removed from the underside of the semiconductor body 1, without disturbing its lattice structure, up to the level of the dash line in FIG. 1b. Since this removal extends somewhat into the p$^+$-diffusion layer 3, the lower edges of the pn-junctions between regions 3 and 4 become exposed.

Now, as is shown in FIG. 1c, the surface thus exposed is provided with an insulating layer 8, preferably by thermal oxidation, and windows are then formed in this layer by an etching process, which windows are precisely below the n-type collector regions 4 and are as large as, or slightly larger than, these regions. An n$^+$-doped low-resistance semiconductor layer 9, for example, is now precipated, preferably from the gaseous phase, on to the last-mentioned side of the semiconductor device, and then the entire upper polycrystalline semiconductor layer 7 is removed, for example with the aid of selective etchants, down to the insulating layer 6, as is shown in FIG. 1c. During the precipitation of the heavily doped semiconductor layer 9 and during the subsequent thermal stages of the process, the zone 10 diffuses out of the heavily doped semiconductor material of layer 9 and acts to passivate the exposed ends of the pn-junctions between regions 3 and 4. Then emitter windows 11 are etched in the insulating layer 6 above the n-type regions 4, and through these windows the emitter zones 12 are produced by a diffusion in of impurity atoms, of phosphorous for example, producing for example n-type conductivity down to such a depth that a base 13 having a thickness of about 0.2 to 0.5 $\mu$ is obtained. Finally, windows 14 are provided in the upper insulating layer for providing contacts for the base zone.

The semiconductor device produced in the manner described above has the great advantage that the thickness of the layer of the monocrystalline semiconductor body no longer represents the base thickness. In addition, it has the advantage of possessing a low-resistance base connection. In order to avoid the difficulties which would arise if the deep p$^+$-diffusion of layers 3 required a long diffusion time or in order to obtain an even deeper p-type zone, and hence a greater layer thickness of the semiconductor body used, it is possible, according to the invention to effect a further p-type diffusion from the underside of the monocrystalline semiconductor body prior to the application of the insulating layer 8. Care must be taken, however, to ensure that this diffusion zone is re-doped again by the subsequently produced zone 10 in the collector region. On the other hand, if the doping concentration produced by the p-type diffusion from the underside of the semiconductor device is so great that redoping can not easily be carried out, then, according to the invention, the collector zone 4 may be masked during the last-described p-diffusion.

According to the invention, it is also possible to effect the production of the base zone after the removal of the semiconductor layer 7 by a diffusion through the windows in the insulating layer 6 prior to the emitter diffusion.

Figure 2A:
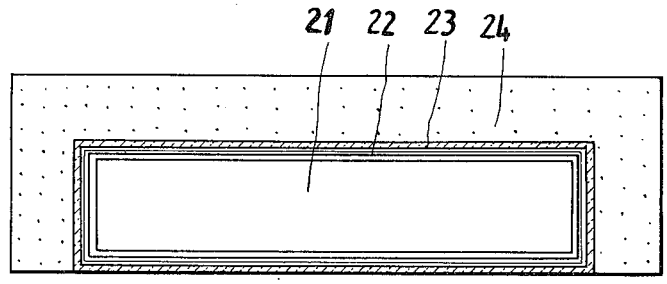
FIGS. 2a, 2b, 2c, 2d and 2e are cross-sectional views showing various stages in the production of a transistor according to a second embodiment of the present invention.

Another example of the invention is illustrated in FIGS. 2a to 2e. Diffused into a monocrystalline semiconductor body 21, for example of p-type conductivity, is a substance producing the same type of conductivity in such a manner that a diffusion profile is produced in the semiconductor body. A plurality of lines 22 indicating varying concentration levels are shown in FIG. 2a. Following this diffusion process, the surface of the semiconductor body is covered on all sides with an insulating layer 23, for example by thermal oxidation, for effecting the passivation of body 21. Then the semiconductor device is covered with polycrystalline semiconductor material 24 in an epitaxial reactor in such a manner that the insulating layer covering one surface of the body 21 remains exposed.

Figure 2B:
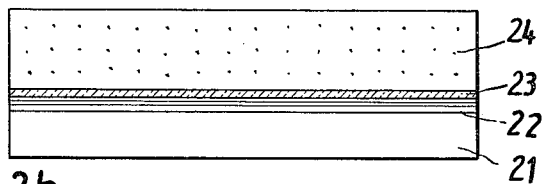

Then portions are removed from that side of the resulting device which is not covered with polycrystalline material, for example by mechanical and/or chemical means, so that only a thin layer with a thickness of, for example, 10 $\mu$ remains of the body 21, as illustrated for a portion of the device in FIG. 2b.

Figure 2C:
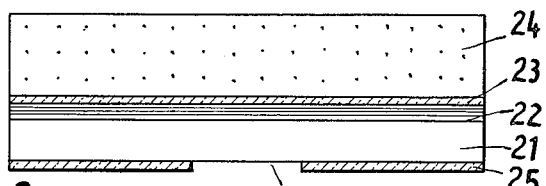

The surface of the resulting thin semiconductor layer is then coated with a new insulating layer 25, for example a layer of silicon oxide, and windows 26 are then formed in this layer, by etching for example with the aid of the photo-mask technique, as shown in FIG. 2c.

Figure 2D:
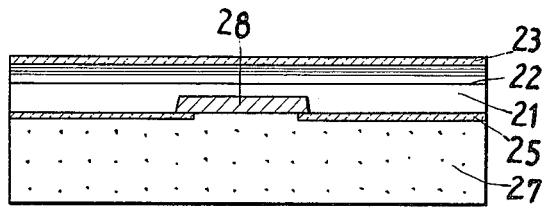

Then the device is again introduced into an epitaxial reactor and semiconductor material which, for example, is heavily doped far into the degenerate region of the opposite type of conductivity from that of semiconductor body 21, such as heavily doped n-type silicon, is deposited particularly on the insulating layer 25 and in the windows 26. This operation acts to create the supporting body 27 and, at least partially, the collector zones 28. According to the invention, it is possible to cause the collector zones 28 to penetrate still further into the semiconductor by means of an additional heat treatment. The auxiliary supporting layer 24 is then removed, for example by means of selective etchants which do not attack the insulating layer 23, so that a device as shown in FIG. 2d is obtained. During the removal of the layer 24, it is necessary to protect the epitaxially deposited layer 27, for example by coating the layer 27 with an insulating layer which is not attacked by the etchant. This insulating layer may, for example, be a thermally grown oxide of the semiconductor material which is later wholly or partially removed in order to permit contact to be made to the collector zone 28.

Figure 2E:
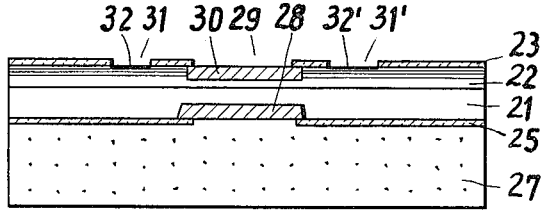

The following processing steps are then carried out in accordance with the usual planar technique: windows 29 are formed in the insulating layer 23, for example by etching, and then, for example, an n-type substance such as phosphorous is diffused into the semiconductor body through these windows to form emitters 30 for the transistors to be produced, as illustrated in FIG. 2e. Finally, windows 31 and 31' are etched in the insulating layer 23 for contacting the base. Ohmic contacts 32 and 32' are then produced, for example by alloying in aluminium to form recrystallization zones.

The description of the embodiment of FIGS. 2 again indicates the essence of the invention, namely the "insertion" of an insulating layer in the collector path region and the production of the collector base pn-junction independently of the diffusion producing the base region. The collector base pn-junction is constructed in a known manner, in accordance with the planar technique, in the form of a passivated junction, i.e. it is disposed under the embedded insulating layer 25 opposite the emitter. Among the advantages possessed by a transistor device produced according to the method of the present invention are: a very low collector path resistance, and accordingly a high power dissipation or a low saturation voltage; a small collector junction area, and accordingly a low collector capacity; and the avoidance of a channel formation between the emitter and collector regions.

A technological difficulty encountered in the practice of the method of the present invention consists in giving the semiconductor layer 21 (FIG. 2b) a uniform thickness across the entire semiconductor arrangement. This problem is not critical, however, because it is known that it is possible to compensate for minor variations in the thickness of a transistor base by adjusting the working voltage level, i.e. by applying a suitable collector voltage.

Figure 3:
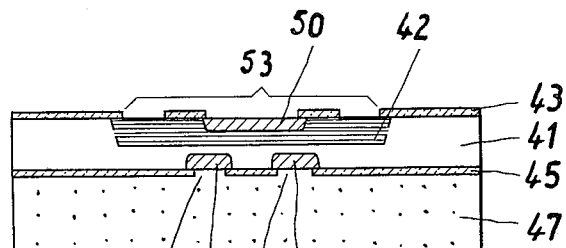
FIG. 3 is a cross-sectional view of a further transistor produced according to the present invention.

Another example of a transistor device according to the present invention is illustrated in FIG. 3. The arrangement shown in FIG. 3 differs from that of FIG. 2 in that, for producing the FIG. 3 arrangement, a p-type substance is diffused into the semiconductor body 41, which has a p-type conductivity for example, through the base window 53 produced in insulating layer 43 in accordance with the usual planar technique, the concentration profile 42 being produced. Windows 46 and 46', through which the collector regions 48 and 48' are introduced, are produced by etching in the insulating layer 45. In this example of the transistor device according to the invention, therefore, the collector region is reduced to such an extent that the collector-to-base pn-junctions are only opposite the emitting edges of the emitter 50. Layer 47 is identical with the layer 27 of FIGS. 2d and 2e.

Figure 4:
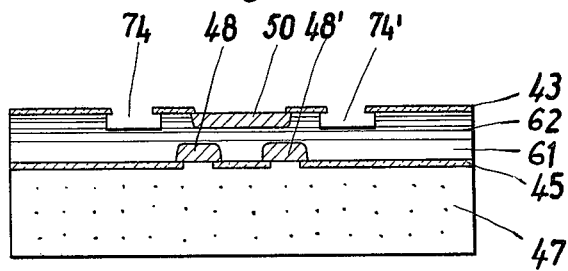
FIG. 4 is a cross-sectional view of a transistor produced according to yet another embodiment of the present invention.

A further example of the invention is shown in FIG. 4. It differs essentially from the example illustrated in FIG. 3 only in that base grooves 74 and 74' are provided in the semiconductor body and the bottoms of the grooves are coated with a conductive layer to form a base electrode in order to reduce the base resistance, and the base region is given a doping profile 62 across its entire extent prior to the application of insulating layer 43.

Figure 5:
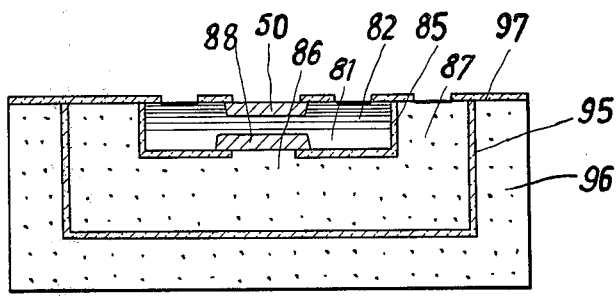
FIG. 5 is a cross-sectional view of a transistor produced according to still another embodiment of the present invention.

According to the invention, it is also possible to fabricate the proposed semiconductor device directly in a solid-state circuit, as indicated with reference to FIG. 5. For this purpose, a semiconductor body 81 having a doping profile 82, which is provided with an insulating layer 97 and a subsequently removed supporting body over it, is provided at its underside with recesses and then covered with an insulating layer 85 in which the windows 86 are then etched for permitting the diffusion of a collector 88. Then the semiconductor device is covered with heavily doped semiconductor material 87 which is subsequently worked to give it the form shown. Then the resulting layer 87 is covered with a fresh insulating layer 95 and with a fresh layer 96 of polycrystalline semiconductor material, and then the first-mentioned supporting body is removed from the semiconductor device in a known manner to such an extent that the arrangement shown in FIG. 5 is obtained. Windows are then formed in insulating layer 97 for the diffusion of emitter 50 and for making contact to the base 81. It is also possible to remove the upper supporting body and layer 97 and to then apply another insulating layer in which windows are formed for effecting the emitter diffusion and the making of contact to the base.

It will be understood that the above description of the present invention is susceptible to various modifications, changes, and adaptations, and the same are intended to be comprehended within the meaning and range of equivalents of the appended claims.

What is claimed is:

1. A transistor comprising in combination: a body of semiconductor material of a first conductivity type having opposed planar major surfaces; an emitter region of the opposite conductivity type disposed in said semiconductor body adjacent one of said major surfaces and forming an emitter-base pn-junction with said body which extends to said one major surface; a layer of insulating material disposed on the opposite surface of said semiconductor body and having an aperture opening therein beneath said emitter region and having approximately the same lateral dimensions as said emitter region; a diffused collector region of said opposite conductivity type disposed within said semiconductor body adjacent said opposite surface and forming a collector-base pn-junction with said body which extends to said opposite major surface adjacent the edges of said aperture opening and beneath said insulating layer; a substrate member of low resistivity conductive material of said opposite conductivity type deposited upon said layer of insulating material and making ohmic contact to said collector region via said aperture opening at least one channel formed in said one major surface in said semiconductor body adjacent the emitting edge of said emitter-base pn-junction; and a conductive layer disposed at the bottom of said channel and ohmically contacting said semiconductor body to form a base electrode for said transistor.

2. A transistor semiconductor device comprising in combination:
a semiconductor body including a monocrystalline collector zone of a first conductivity type and a completely monocrystalline base zone of the opposite conductivity type which extends to an upper surface of said semiconductor body, both of said zones defining a collector-base pn-junction; said semiconductor body further including an emitter zone of said first conductivity type disposed in said base zone and defining an emitter-base pn-junction therewith; at least one layer of insulating material disposed within said semiconductor body, said layer of insulating material separating said collector zone from said base zone except for a limited area beneath said emitter zone in which said collector-base pn-junction is defined; at least one channel formed in said upper surface of said semiconductor body within said completely monocrystalline base zone and adjacent the emitting edge of said emitter-base pn-junction; and a conductive layer disposed at the bottom of said channel and contacting said base zone to form a base electrode for said transistor.

3. An arrangement as defined in claim 1, wherein said semiconductor body has a low-resistance part of said completely monocrystalline base zone surrounding at least its emitter junction.

* * * * *